(12) United States Patent
Cho

(10) Patent No.: US 8,772,862 B2
(45) Date of Patent: Jul. 8, 2014

(54) SEMICONDUCTOR DEVICE AND METHOD FOR FABRICATING THE SAME

(71) Applicant: SK hynix Inc., Gyeonggi-do (KR)

(72) Inventor: Heung-Jae Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/711,673

(22) Filed: Dec. 12, 2012

(65) Prior Publication Data

US 2014/0021485 A1   Jan. 23, 2014

(30) Foreign Application Priority Data

Jul. 17, 2012   (KR) .................. 10-2012-0077772

(51) Int. Cl.
*H01L 29/66* (2006.01)

(52) U.S. Cl.
USPC ........... 257/329; 257/296; 257/300; 257/303; 257/316; 257/330; 438/213; 438/238; 438/242; 438/245; 438/263; 438/270

(58) Field of Classification Search
USPC ............... 257/329, 296, 300, 303, 316, 330; 438/213, 238, 242, 245, 263, 270
See application file for complete search history.

(56) References Cited

U.S. PATENT DOCUMENTS

2008/0258209 A1* 10/2008 Oyu .............................. 257/329
2010/0219466 A1*  9/2010 Sung et al. .................... 257/329

FOREIGN PATENT DOCUMENTS

KR           100860744           9/2008

OTHER PUBLICATIONS

Celisa K. Date and James D. Plummer,"Suppression of the Floating-Body Effect Using SiGe Layers in Vertical Surrounding-Gate MOSFETs," IEEE Transactions on Electron Devices, Dec. 2001, pp. 2684-2689, vol. 48, No. 12.

* cited by examiner

*Primary Examiner* — Kyoung Lee
*Assistant Examiner* — Ratisha Mehta
(74) *Attorney, Agent, or Firm* — IP & T Group LLP

(57) ABSTRACT

A vertical channel transistor includes a pillar formed over a substrate, and a gate electrode formed on sidewalls of the pillar, wherein the pillar includes a source area, a vertical channel area over the source area, a drain area over the vertical channel area, and a leakage prevention area interposed between the vertical channel area and the drain area.

21 Claims, 13 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2012-0077772, filed on Jul. 17, 2012, which is incorporated herein by reference in its entirety.

BACKGROUND

1. Field

Exemplary embodiments of the present invention relate to a semiconductor, and more particularly, to a vertical channel transistor, a method for fabricating the same, and a semiconductor device including the same.

2. Description of the Related Art

Most semiconductor devices include transistors. For example, a memory cell of a memory device such as DRAM includes a cell transistor such as a metal-oxide-semiconductor field-effect transistor (MOSFET). In general, the MOSFET forms a source/drain area in a semiconductor substrate, and a planar channel is formed between the source area and the drain area. Such a MOSFET is referred to as a planar channel transistor.

Since the improvement of integration degree and performance of semiconductor devices has continuously improved, the fabrication technology of the MOSFET is approaching its physical limit. For example, with the decrease in size of memory cells, the size of the MOSFET has been reduced. Thus, the channel length of the MOSFET has also been inevitably reduced. When the channel length of the MOSFET is reduced, the characteristics of a memory device may be degraded due to various problems. For example, data maintenance characteristics may be degraded.

To overcome the above-described problem, a vertical channel transistor has been proposed. The vertical channel transistor has a source area and a drain area, which are formed in the upper and lower parts of a pillar. The pillar becomes a channel, and a vertical gate electrode is formed on sidewalls of the pillar.

FIG. 1 illustrates a conventional vertical channel transistor.

Referring to FIG. 1, the conventional vertical channel transistor includes a pillar P, a gate dielectric layer 13, and a gate electrode 14. The pillar P includes a source area 11B, a drain area 11A, and a vertical channel area 12.

The source area 11B and the drain area 11A may be formed in the upper and lower parts of the pillar P, respectively, through ion implantation, and may include an N-type junction area.

FIGS. 2A and 2B are energy band diagrams of the conventional vertical channel transistor.

Referring to FIG. 2A, with the size reduction of the silicon pillar, the vertical channel transistor is formed as a floating type so that a channel is isolated from a body by the N$^+$ area. In such a structure, holes generated during transistor operation may not escape to the body but may accumulate in the channel as illustrated in FIG. 2B, thereby continuously increasing a channel potential.

As a result, a threshold voltage Vth may significantly vary, and junction leakage to the N$^+$ area increases, thereby having negative effects on refresh characteristics, which are among the most important for DRAM.

SUMMARY

Embodiments of the present invention are directed to a semiconductor device capable of improving a refresh characteristic by reducing junction leakage and a method for fabricating the same.

In accordance with an embodiment of the present invention, a vertical channel transistor includes a pillar formed over a substrate, and a gate electrode formed on sidewalls of the pillar, wherein the pillar includes a source area, a vertical channel area over the source area, a drain area over the vertical channel area, and a leakage prevention area interposed between the vertical channel area and the drain area.

In particular, the leakage prevention area may include a layer containing carbon (C), the leakage prevention area may include silicon carbide (SiC), the drain area may include silicon, and the drain area may include single crystalline silicon.

In accordance with another embodiment of the present invention, a method for fabricating a vertical channel transistor includes forming a pillar over a substrate, and forming a gate electrode on sidewalls of the pillar, wherein the pillar includes a source area, a vertical channel area over the source area, a leakage prevention area over the vertical channel area, and a drain area.

In particular, the forming of the pillar may include forming a pillar pattern by etching the substrate, forming a leakage prevention area at an upper part of the pillar pattern, forming a silicon layer over the leakage prevention area, and forming a drain area and a source area by ion-implanting impurities into the silicon layer and a lower part of the pillar pattern.

Furthermore, the forming of the leakage prevention area may include performing ion implantation with a target set to a predetermined depth from the surface of the pillar pattern, performing ion implantation on the surface of the pillar pattern, or performing epitaxial growth over the pillar pattern.

Furthermore, the forming of the silicon layer may include performing epitaxial growth over the leakage prevention area.

Furthermore, the forming of the pillar may include forming a leakage prevention area over the substrate, forming a silicon layer over the leakage prevention area, forming the pillar by etching the leakage prevention area, the silicon layer, and the substrate, and forming a drain area and a source area by ion-implanting impurities into the silicon layer and a lower part of the pillar.

Furthermore, the leakage prevention area may include a layer containing carbon.

In accordance with yet another embodiment of the present invention, a semiconductor device includes a pillar formed over a substrate including a buried bit line, a gate electrode formed on sidewalls of the pillar, and a capacitor connected to a drain area of the pillar, wherein the pillar includes a source area connected to the buried bit line, a vertical channel area over the source area, a leakage prevention area over the vertical channel area, and a drain area over the leakage prevention area.

DETAILED DESCRIPTION

Figure 1:
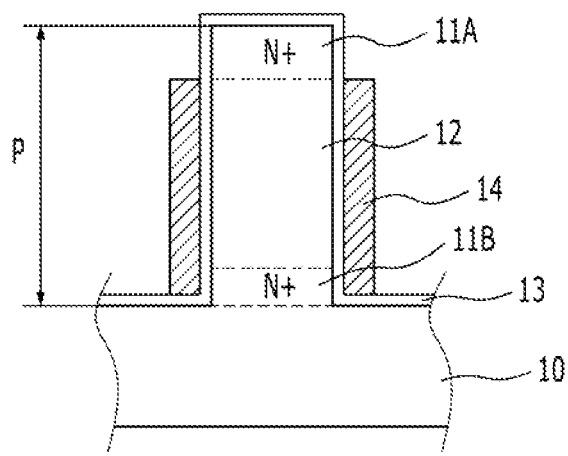
FIG. 1 is a cross-sectional view of a conventional vertical channel transistor.
Figure 2A:
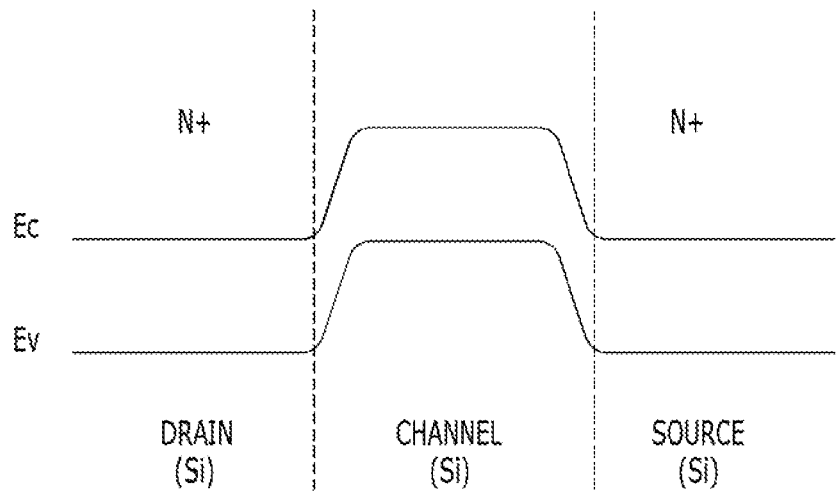
FIGS. 2A and 2B are energy band diagrams of the conventional vertical channel transistor.
Figure 2B:
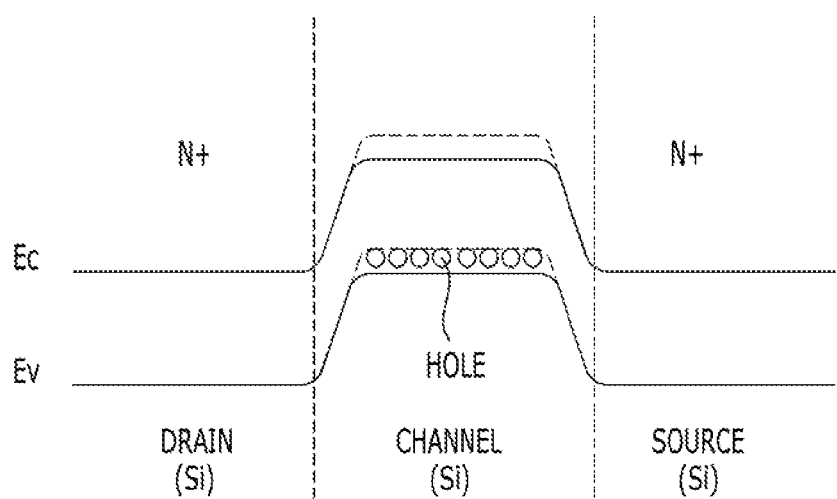

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

FIGS. 3A to 3E are cross-sectional views of vertical channel transistors in accordance with first to sixth embodiments of the present invention.

Figure 3A:
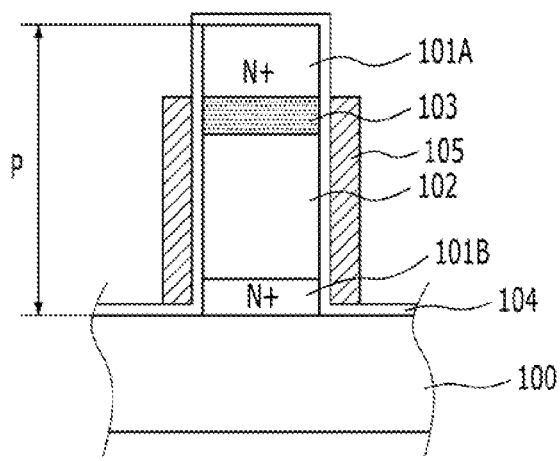
FIGS. 3A to 3F are cross-sectional views of vertical channel transistors illustrating first to sixth embodiments of the present invention.

Referring to FIG. 3A, the vertical channel transistor in accordance with the first embodiment of the present invention includes a pillar P, a gate dielectric layer 104, and a gate electrode 105.

First, a plurality of pillars P are formed over a semiconductor substrate 100 to protrude perpendicularly from the surface of the semiconductor substrate 100. Each of the pillars P may include a source area 101B, a vertical channel area 102 over the source area 101B, a leakage prevention area 103 over the vertical channel area 102, and a drain area 101A over the leakage prevention area 103.

The semiconductor substrate 100 may include a material containing silicon, and may include a silicon substrate, for example. Therefore, the pillar P may include a semiconductor pillar or a silicon pillar. The gate dielectric layer 104 may include a silicon oxide and a high-K material. The gate electrode 105 may include a conductive material, and the conductive material may include a polysilicon or a metal electrode. The metal electrode may include a stacked structure of a barrier metal and an electrode metal or only an electrode metal. The electrode metal may include a single layer or multiple layers.

The leakage prevention area 103 serves to increase a valance band offset to prevent junction leakage to the drain area 103.

The leakage prevention area 103 is formed over the vertical channel area 102, and the top surface of the leakage prevention area 103 have substantially the same level as the height of the gate electrode 105. Therefore, the leakage prevention area 103 and the vertical channel area 102 may become a channel area of the pillar P.

The leakage prevention area 103 may include a layer containing carbon (C), and the concentration of C in the layer may be set in the range of about 0.01% to 20%, for example. The leakage prevention area 103 may be formed to a thickness of about 10 Å to 1,000 Å.

The leakage prevention area 103 may be formed by epitaxial growth or ion implantation.

As the leakage prevention area 103 having a large valance band offset is formed, the energy of holes becomes unstable toward the drain area, thereby reducing junction leakage to the drain area. As a result, it may be possible to prevent a refresh reduction caused by the hole accumulation.

Figure 3B:
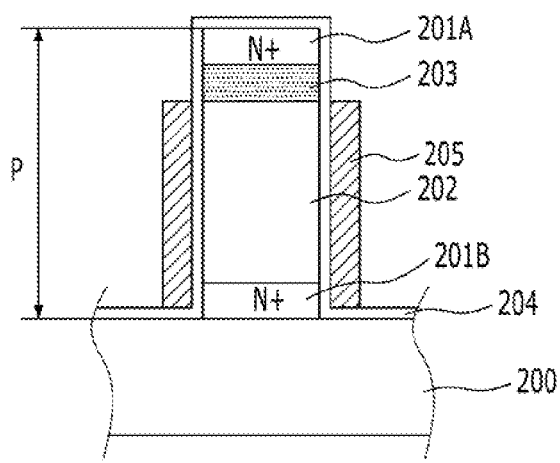
Figure 3C:
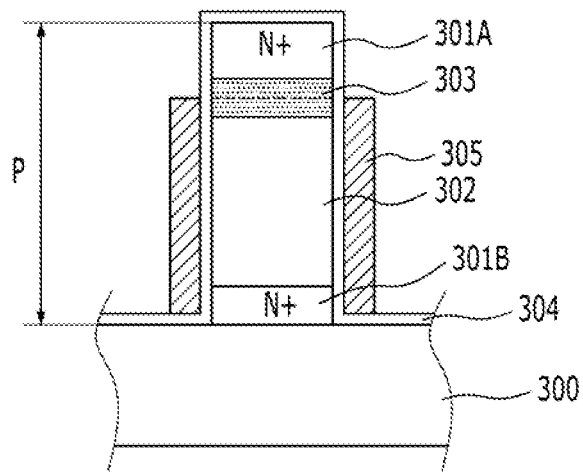

FIGS. 3B to 3F illustrate the vertical channel transistors in accordance with the second to sixth embodiment of the present invention. In the second and third embodiments of the present invention as illustrated in FIGS. 3B and 3C, source areas 201B and 301B may be formed in the lower part of a pillar P like the source area 101B in accordance with the first embodiment of the present invention.

Referring to FIG. 3B, a leakage prevention area 203 of the vertical channel transistor in accordance with the second embodiment of the present invention may be adjusted in such a manner that the bottom surface thereof has substantially the same level as the top surface of a gate electrode 205. Therefore, the leakage prevention area 203 may be included in a drain area 201A.

Referring to FIG. 3C, a leakage prevention area 303 of the vertical channel transistor in accordance with the third embodiment of the present invention may be formed over and under the level of the top surface of a gate electrode. That is, the leakage prevention area 303 may be interposed between a vertical channel area 302 and a drain area 301A. In short, the leakage channel area may be formed in a part of the drain area and a part of the vertical channel area.

Figure 3D:
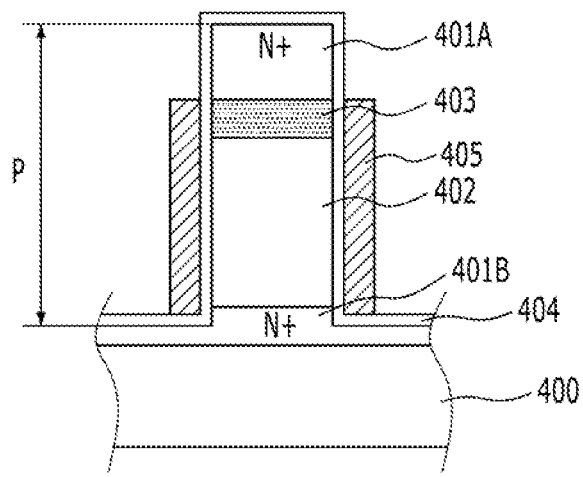
Figure 3E:
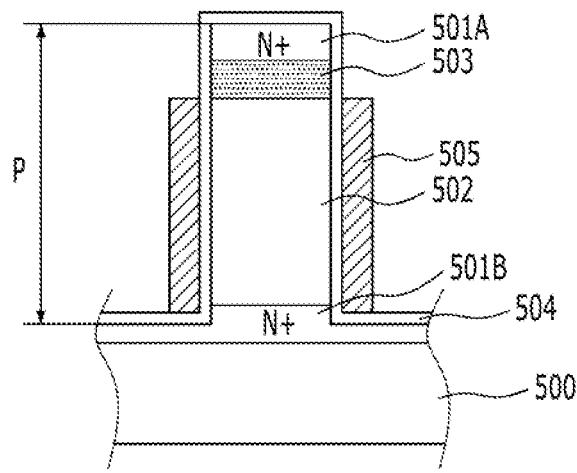
Figure 3F:
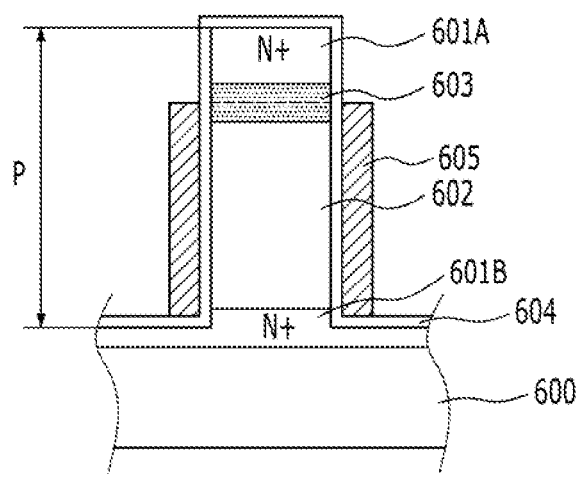

In the fourth to sixth embodiment of the present invention as illustrated in FIGS. 3D to 3F, leakage prevention areas 403, 503, and 603 are formed at the same positions as in the first to third embodiment of the present invention, respectively, and source areas 401B, 501B, and 601B may be formed across a pillar and a substrate. That is, the source areas in accordance with the first to third embodiments of the present invention are formed only in the respective transistors, but the source areas in accordance with the fourth and sixth embodiments of the present invention are formed as common source areas across the pillar and the substrate.

Referring to FIG. 3D, a leakage prevention area 403 of the vertical channel transistor in accordance with the fourth embodiment of the present invention may be formed over the vertical channel area 402, and the top surface of the leakage prevention area 403 may have substantially the same level as the height of the gate electrode 405. Therefore, the leakage prevention area 403 and the vertical channel area 402 may serve as a channel area of the pillar P. The source area 401B may serve as a common source area formed across the pillar P and the substrate 400.

Referring to FIG. 3E, a leakage prevention area 503 of the vertical channel transistor in accordance with the fifth embodiment of the present invention may be controlled in such a manner that the bottom surface thereof has substantially the same level as the height of a gate electrode 505. Therefore, the leakage prevention area 503 may be included in the drain area 501A. The source area 501B may serve as a common source area formed across the pillar P and the substrate 500.

Referring to FIG. 3F, a leakage prevention area 603 of the vertical channel transistor in accordance with the sixth embodiment of the present invention may be formed over and under the level of the top surface of a gate electrode 605. That is, the leakage prevention area 603 may be interposed between the vertical channel area 602 and the drain area 601A. In short, the leakage channel area may be formed in a part of the drain area and a part of the vertical channel area. The source area may serve as a common source area formed across the pillar P and the substrate 600.

FIGS. 4A to 4E are cross-sectional views illustrating a method for fabricating the vertical channel transistor in accordance with the first embodiment of the present invention.

Figure 4A:
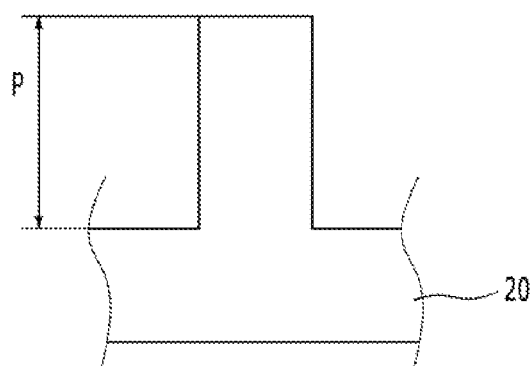
FIGS. 4A to 4F are cross-sectional views illustrating a method for fabricating the vertical channel transistor in accordance with the first embodiment of the present invention.

Referring to FIG. 4A, a semiconductor substrate 20 is anisotropically etched to a thickness depth to form a pillar P. More specifically, the pillar P may be formed by the following process: a hard mask layer pattern (not illustrated) is formed over the semiconductor substrate 20, the semiconductor substrate 20 is etched using the hard mask layer pattern as an etch mask, and the hard mask layer pattern is removed.

The semiconductor substrate 20 may include a material containing silicon, and may include a silicon substrate, for example. Furthermore, the semiconductor substrate 20 may include a body subjected to a predetermined process such as a buried bit line process. The hard mask layer pattern may be formed of a material having an etching selectivity with respect to the semiconductor substrate 20, and may include any one or two or more selected from the group including silicon nitride, silicon oxide, and amorphous carbon.

The pillar P is a structure for forming a vertical channel transistor. The adjacent pillars P are isolated by a trench formed by etching the semiconductor substrate 20, and extended vertically from the surface of the semiconductor substrate 20.

Figure 4B:
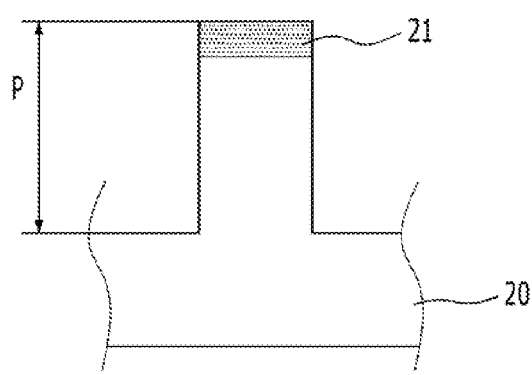

Referring to FIG. 4B, a leakage prevention area 21 is formed at the top of the pillar P. The leakage prevention area 21 serves to prevent holes accumulated in a channel from junction leakage to a drain area, during transistor operation. The leakage prevention area 21 may include a material having a valance band offset, and may include a layer formed with carbon containing material. The carbon containing layer may include silicon carbide (SiC).

The leakage prevention area 21 may be formed by epitaxial growth or ion implantation.

When the leakage prevention area 21 is formed by ion implant, an ion implant target may be controlled to a depth of about 100 Å to 5,000 Å from the surface of the pillar P, and an ion implantation dose may be set in the range of about $1 \times 10^{14}$ atoms/cm$^2$ to $1 \times 110^7$ atoms/cm$^2$. Furthermore, an annealing process for recrystallizing an amorphous layer formed by ion implantation may be additionally performed, and a mask process, which may prevent impurities from being unnecessarily ion-implanted between the pillars P, may be additionally performed.

Furthermore, when the leakage prevention area 21 is formed, any one dopant selected from the group including boron (B), arsenic (As), and phosphorous (P) may be in-situ doped, if necessary.

When the leakage prevention area 21 is formed of SiC, the content of C in the leakage prevention area 21 may range from about 0.01% to 20%, and the leakage prevention area 21 may have a thickness of about 1 nm to 100 nm.

Figure 4C:
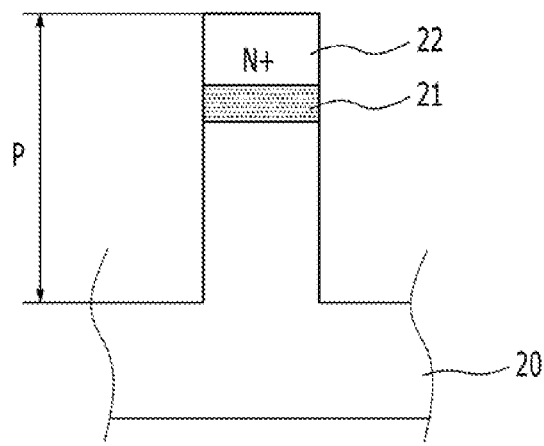

Referring to FIG. 4C, a silicon layer 22 is formed over the leakage prevention area 21. The silicon layer 22 is a structure for forming a junction area, that is, a drain area, and may be formed to a thickness of about 2,000 Å or less. The silicon layer 22 may include single crystalline silicon.

The silicon layer 22 may be formed by epitaxial growth. Furthermore, when the silicon layer 22 is formed, any one selected from the group including B, As, and P may be in-situ doped, if necessary.

In particular, the silicon layer 22 may be formed over the leakage prevention area 21 or defined by the leakage prevention area 21 through epitaxial growth. For example, when the leakage prevention area 21 is formed at the surface of the pillar P, the silicon layer 22 may be formed over the leakage prevention layer 21. Alternatively, when the leakage prevention area 21 is formed at a predetermined depth from the surface of the pillar P through ion implant, the top of the leakage prevention area 21 may be defined as the silicon layer 22.

Figure 4D:
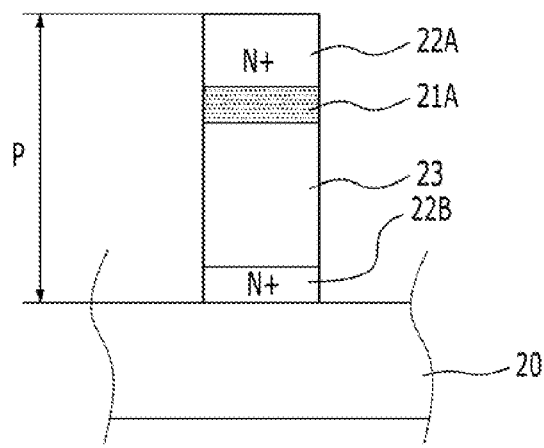

Referring to FIG. 4D, junction areas 22A and 22B are formed by ion-implanting impurities into the silicon layer 22 and the lower part of the pillar P. The junction area 22B in the lower part of the pillar P becomes a source area 22B, and the ion-implanted silicon layer 22A becomes a drain area 22A. FIG. 4D illustrates the N-type junction areas 22A and 22B into which N-type impurities are ion-implanted. However, the junction areas 22A and 22B may include P-type junction areas into which P-type impurities are ion-implanted.

In this embodiment of the present invention, the source area 22B is formed in the lower part of the pillar P to be located only in the transistor. As Illustrated in FIGS. 3D to 3F, however, the source area 22B may be formed as a common source area across the pillar P and the semiconductor substrate 20.

A vertical channel area 23 is formed between the source area 22B and the drain area 22A.

As a result, the pillar P has a structure in which the source area 22B, the vertical channel area 23, the leakage prevention area 21A, and the drain area 22A are sequentially stacked from the substrate.

Figure 4E:
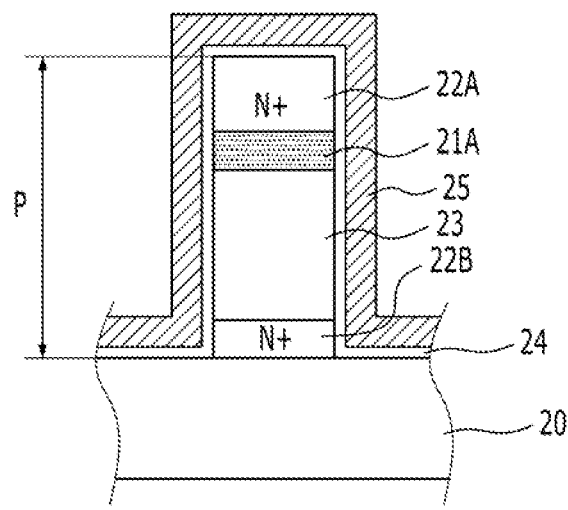

Referring to FIG. 4E, an insulating layer 24 is formed along the semiconductor substrate 20 including the pillar P. The insulating layer 24 serves to protect the semiconductor substrate 20 and the pillar P including the drain area 22A during a subsequent process. The insulating layer 24 serves as a gate dielectric layer. The insulating layer 24 may be formed of oxide, and the oxide may include silicon oxide ($SiO_2$). The dielectric layer 24 may be formed by a method selected from the group including dry oxidation, wet oxidation, and radical oxidation.

Then, a conductive layer 25 is formed over the dielectric layer 24. The conductive layer 25 may be formed to such a thickness so that the layer does not fill a space between adjacent pillars P. The conductive layer 25 is a structure for forming a gate electrode, and may include polysilicon or a metal layer. The metal layer may include any one selected from the group including titanium (Ti), tantalum (Ta), ruthenium (Ru), titanium nitride (TiN), tantalum nitride (TaN), TiB$_2$, and TaSiN or a stacked layer thereof.

Figure 4F:
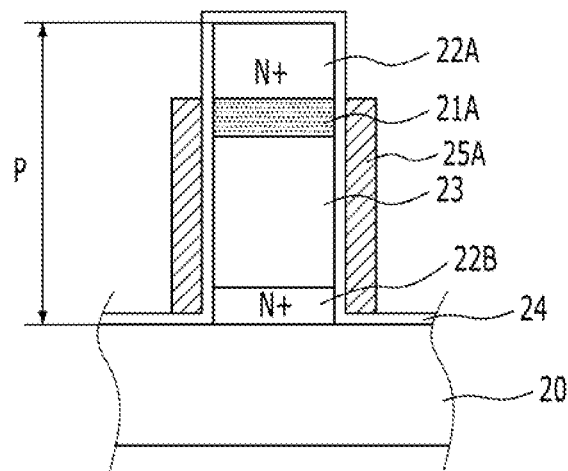

Referring to FIG. 4F, the conductive layer 25 is etched to form a gate electrode 25A on the sidewalls of the pillar P. The gate electrode 25A may be formed in a line type on both sidewalls of the pillar P or may be formed in a ring shape to surround the vertical channel area 23.

The etching process for forming the gate electrode 25A may be formed by a dry etch process. The dry etch process may include a blanket process, for example, an etch back process. At this time, when the conductive layer 25 is left between the adjacent pillars P, a bridge may be formed.

Therefore, an etch condition having a high selectivity between the insulating layer 24 and the conductive layer 25 may be used to perform the etching process to prevent the formation of the bridge and the damage of the insulating layer 24. That is, an etch condition of selectively etching only the conductive layer 25 without etching the insulating layer 24 may be applied.

In this embodiment of the present invention, the leakage prevention area 21 is surrounded by the gate electrode 25A and serves as a channel with the vertical channel area 23. As illustrated in FIG. 3B, however, the leakage prevention area 21 may be formed at a higher level than the height of the gate electrode 25A and serve as a junction area. Furthermore, as illustrated in FIG. 3C, the leakage prevention area 21 may be formed to be included in both of the junction area and the channel area. As such, the level of the leakage prevention area 21 may be controlled according to the formation method and condition.

As described above, the leakage prevention area 21 is formed to be contacted with the drain area 22A, and formed of SiC having a large valance band offset. Therefore, it may be possible to prevent holes from being accumulated in the drain area 22A. That is, although holes are accumulated in the channel due to a floating body effect, the holes are not accumulated in the drain area having unstable energy, but gathered toward the source area. Therefore, junction leakage of the drain area may be reduced, and refresh reduction caused by the hole accumulation may be improved.

The role of the leakage prevention area 21 will be described in detail with reference to FIGS. 6A and 6B.

FIGS. 5A to 5E are cross-sectional views Illustrating a method for fabricating the vertical channel transistor in accordance with the first embodiment of the present invention.

Figure 5A:
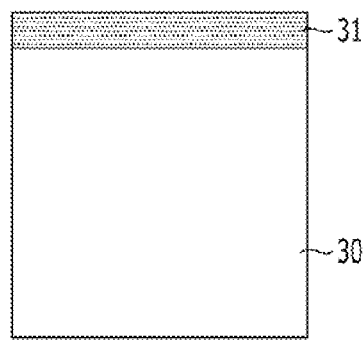
FIGS. 5A to 5F are cross-sectional views illustrating another method for fabricating the vertical channel transistor in accordance with the first embodiment of the present invention.

Referring to FIG. 5A, a leakage prevention area 31 is formed over a semiconductor substrate 30. The semiconductor substrate 30 may include a material containing silicon, and may include a silicon substrate, for example. Furthermore, the semiconductor substrate may include a body subjected to a predetermined process such as a buried bit line process.

The leakage prevention area 31 serves to prevent holes accumulated in a channel from junction leakage to a drain area, during transistor operation. The leakage prevention area 31 may include a material having a large valance band offset, and may include a layer containing carbon. The layer may include SiC, for example.

The leakage prevention area 31 may be formed by epitaxial growth or ion implantation. Furthermore, the leakage prevention area 31 may be formed on the entire surface of the semiconductor substrate 30, or locally on the semiconductor substrate 30. At this time, a mask process may be additionally performed to locally form the leakage prevention area 31.

When the leakage prevention area 31 is formed by ion implant, an ion implantation target is controlled to a depth of about 100 Å to 5,000 Å from the surface of the pillar P, and an ion implantation dose may be set in the range of about $1 \times 10^{14}$ atoms/cm$^2$ to $1 \times 10^{17}$ atoms/cm$^2$. Furthermore, an annealing process for recrystallizing an amorphous layer formed by ion implantation may be additionally performed, and a capping layer for preventing impurities from being unnecessarily ion-implanted between the pillars P may be additionally formed.

Furthermore, when the leakage prevention area 31 is formed, any one dopant selected from the group including B, As, and P may be in-situ doped, if necessary.

When the leakage prevention area 31 is formed of SiC, the content of C in the leakage prevention area 31 may range from about 0.01% to 20%, and the leakage prevention area 31 may have a thickness of about 1 nm to 100 nm.

Figure 5B:
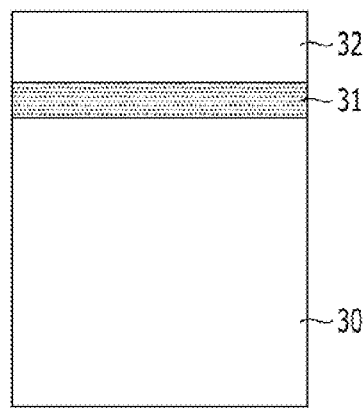

Referring to FIG. 5B, a silicon layer 32 is formed over the leakage prevention area 31. The silicon layer 32 is a structure for forming a junction area, that is, a drain area, and may be formed to a thickness of about 2,000 Å or less. The silicon layer 32 may include single crystalline silicon.

The silicon layer 32 may be formed by epitaxial growth. Furthermore, when the silicon layer 32 is formed, any one selected from the group including B, As, and P may be in-situ doped, if necessary.

In particular, the silicon layer 32 may be formed over the leakage prevention area 31 or defined by the leakage prevention area 31 through epitaxial growth. For example, when the leakage prevention area 31 is formed at the surface of the semiconductor substrate 30, the silicon layer 32 may be formed over the leakage prevention layer 31. Alternatively, when the leakage prevention area 31 is formed at a predetermined depth from the surface of the semiconductor substrate 30 through ion implantation, the top of the leakage prevention area 31 may be defined as the silicon layer 32.

Figure 5C:
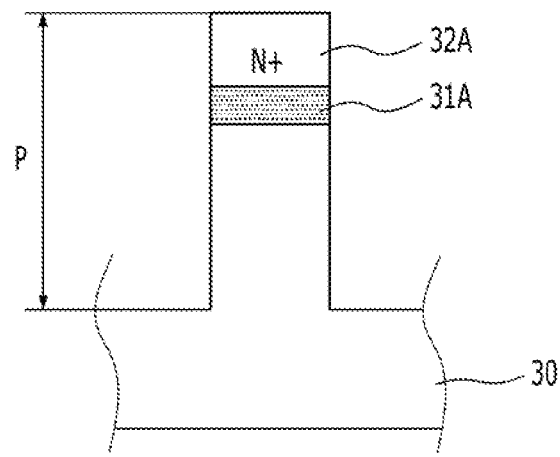

Referring to FIG. 5C, the silicon layer 32 and the leakage prevention area 31 are etched, and the semiconductor substrate 30 is partially etched to form a pillar B isolated by a trench.

The pillar P may be formed by the following process: a hard mask layer pattern (not illustrated) is formed over the silicon layer 32, the silicon layer 32 and the leakage prevention area 31 are etched using the hard mask layer pattern as an etch mask, and the semiconductor substrate 30 is partially etched. The hard mask layer pattern may be formed of a material having an etching selectivity with respect to the semiconductor substrate 30, and may include any one or two or more selected from the group including silicon nitride, silicon oxide, and amorphous carbon.

Figure 5D:
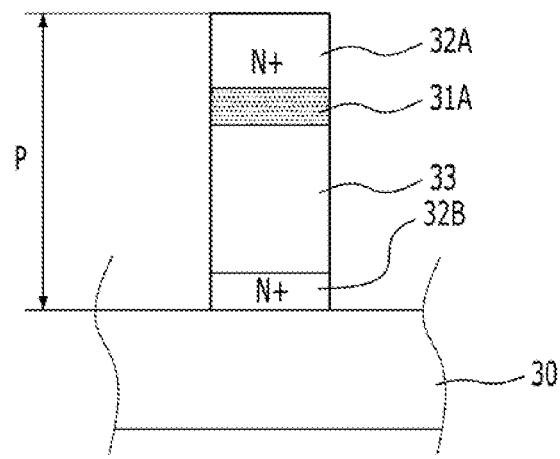

Referring to FIG. 5D, junction areas 32A and 32B are formed by ion-implanting impurities into the silicon layer 32 and the lower part of the pillar P. The junction area 32B in the lower part of the pillar P becomes a source area 32B, and the ion-implanted silicon layer 32A becomes a drain area 32A. FIG. 5D illustrates the N-type junction areas 32A and 32B into which N-type impurities are ion-implanted. However, the junction areas 32A and 32B may include P-type junction areas into which P-type impurities are ion-implanted.

In this embodiment of the present invention, the source area 32B is formed in the lower part of the pillar P to be located only in the transistor. As Illustrated in FIGS. 3D to 3F, however, the source area 32B may be formed as a common source area across the pillar P and the semiconductor substrate 30.

A vertical channel area 33 is formed between the source area 32B and the drain area 32A.

As a result, the pillar P has a structure in which the source area 32B, the vertical channel area 33, the leakage prevention area 31A, and the drain area 32A are sequentially stacked from the substrate.

Figure 5E:
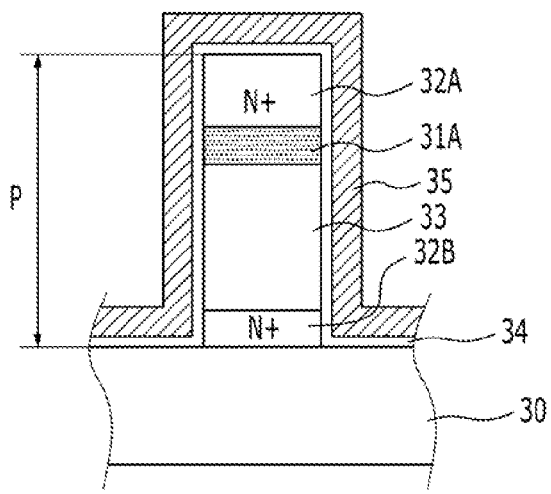

Referring to FIG. 5E, an insulating layer 34 is formed along the semiconductor substrate 30 including the pillar P. The insulating layer 34 serves to protect the semiconductor substrate 30 and the pillar P including the drain area 32A during a subsequent process. The insulating layer 34 serves as a gate dielectric layer. The insulating layer 34 may be formed of oxide, and the oxide may include silicon oxide ($SiO_2$). The insulating layer 34 may be formed by a method selected from the group including dry oxidation, wet oxidation, and radical oxidation.

Then, a conductive layer 35 is formed over the insulating layer 34. The conductive layer 35 may be formed to such a thickness so that the layer does not fill a space between adjacent pillars P. The conductive layer 35 is a structure for forming a gate electrode, and may be formed of polysilicon or a metal layer. The metal layer may include any one selected from the group including Ti, Ta, Ru, TiN, TaN, TiB$_2$, and TaSiN or a stacked layer thereof.

Figure 5F:
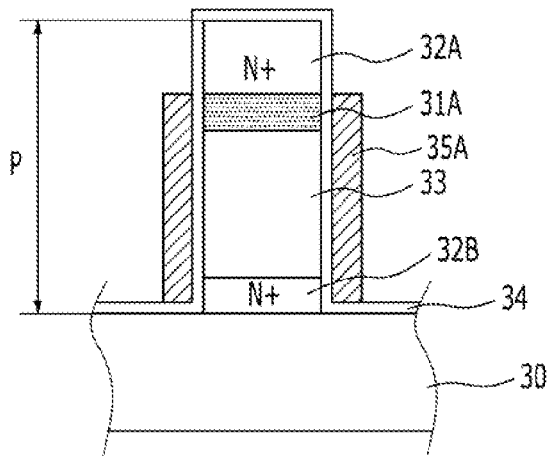

Referring to FIG. 5F, the conductive layer 35 is etched to form a gate electrode 35A to surround the vertical channel area 33. The gate electrode 35A may be formed in a line type on both sidewalls of the pillar P or may be formed in a ring shape to surround the vertical channel area 33.

The etching process for forming the gate electrode 35A may be formed by a dry etch process. The dry etch process may include a blanket process, for example, an etch back process. At this time, when the conductive layer 35 is left between the adjacent pillars P, a bridge may be formed. Therefore, an etch condition having a high selectivity between the insulating layer 34 and the conductive layer 35 may be used to perform the etching process to prevent the formation of the bridge and the damage of the insulating layer 34. That is, an etch condition of selectively etching only the conductive layer 35 without etching the insulating layer 34 may be applied.

In this embodiment of the present invention, the leakage prevention area 31 is surrounded by the gate electrode 35A and serves as a channel with the vertical channel area 33. As illustrated in FIG. 3B, however, the leakage prevention area 31 may be formed at a higher level than the height of the gate electrode 35A and serve as a junction area. Furthermore, as illustrated in FIG. 3C, the leakage prevention area 31 may be formed to be included in both of the junction area and the channel area. As such, the level of the leakage prevention area 31 may be controlled according to the formation method and condition, and perform the role of the area included according to the level.

As described above, the leakage prevention area 31 is formed to be contacted with the drain area 32A, and formed of SiC having a large valance band offset. Therefore, it may be possible to prevent holes from being accumulated in the drain area 32A. That is, although holes are accumulated in the channel due to a floating body effect, the holes are not accumulated in the drain area having unstable energy, but gathered toward the source. Therefore, junction leakage of the drain area may be reduced, and a refresh reduction caused by the hole accumulation may be improved.

The role of the leakage prevention area 31 will be described in detail with reference to FIGS. 6A and 6B.

Figure 6A:
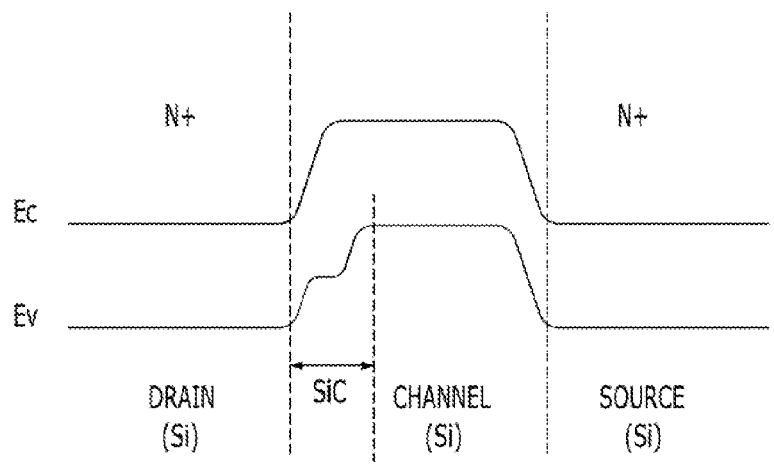
FIGS. 6A and 6B energy band diagrams of the vertical channel transistor in accordance with the embodiment of the present invention.
Figure 6B:
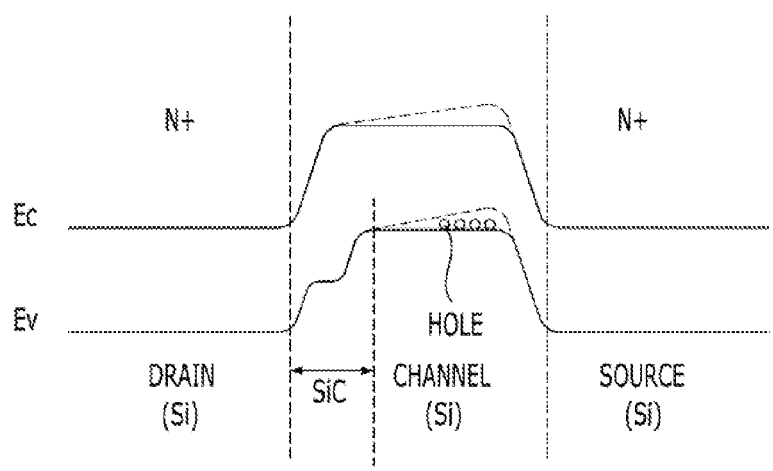

FIGS. 6A and 6B are energy band diagrams of the vertical channel transistor in accordance with the embodiment of the present invention.

Referring to FIG. 6A, the leakage prevention area, that is, the SIC layer is formed between the drain area and the channel area so that a bandgap between a valance band and a conduction band may increase. In such a structure, although holes generated during transistor operation are accumulated in the body, the holes are gathered toward the source area, as illustrated in FIG. 6B. Therefore, it may be possible to prevent junction leakage to the drain area. As a result, a refresh reduction caused by the hole accumulation may be prevented.

Figure 7:
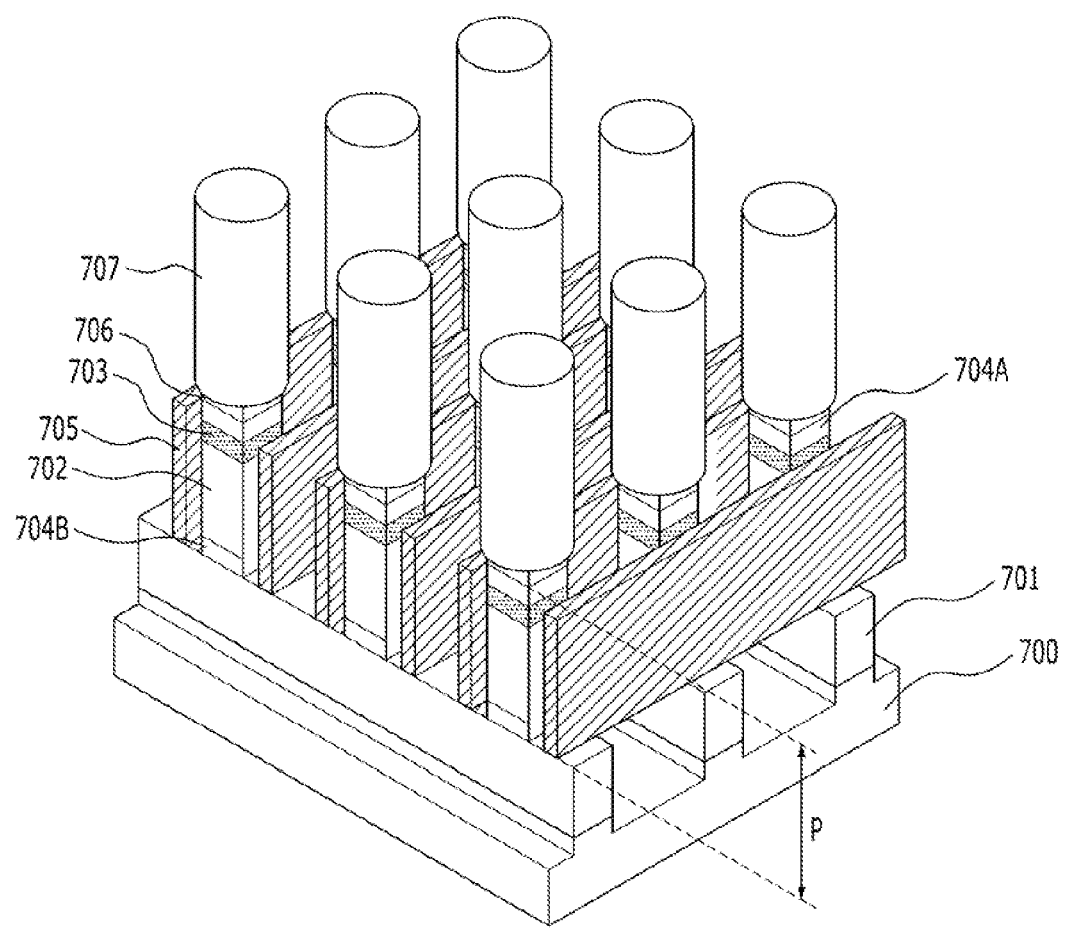
FIG. 7 is a perspective view of a semiconductor device to which the vertical channel transistor in accordance with the first embodiment of the present invention is applied.

FIG. 7 is a perspective view of a semiconductor device to which the vertical channel transistor in accordance with the first embodiment of the present invention is applied.

Referring to FIG. 7, the vertical channel transistor includes pillars P and gate electrodes 705. Each of the pillars P includes junction areas 704A and 704B, a vertical channel area 702, and a leakage prevention area 703. The buried bit lines 701 and capacitors 707 are connected to the vertical channel transistor, thereby implementing a semiconductor device such as DRAM. The buried bit lines 701 may be electrically connected to the lower part of the pillar P. The buried bit line 701 may be formed vertically over the semiconductor substrate 701, and extended in a first direction. The gate electrode 705 may be extended in a second direction crossing the first direction. The capacitors 707 may be electrically connected to the top of the pillar P. The contact plugs 706 may be further included between the capacitors 707 and the pillars P. Although not illustrated, the capacitor 707 may include a storage node, a dielectric layer, and a plate node. The vertical channel transistor may be utilized to not only a memory such as DRAM but also a nonvolatile memory such as a flash memory.

In accordance with the embodiments of the present invention, the leakage prevention area is interposed between the channel area and the drain area to prevent holes from accumulated toward the drain area. Therefore, junction leakage may be reduced and a refresh characteristic may be improved.

While the present invention has been described with respect to the specific embodiments, it will be apparent to those skilled in the art that various changes and modifications may be made without departing from the spirit and scope of the invention as defined in the following claims.

What is claimed is:

1. A vertical channel transistor comprising:
    a pillar formed over a substrate; and
    a gate electrode formed on sidewalls of the pillar,
    wherein the pillar comprises a source area, a vertical channel area over the source area, a drain area over the vertical channel area, and a leakage prevention area interposed between the vertical channel area and the drain area.

2. The vertical channel transistor of claim 1, wherein the leakage prevention area comprises a layer containing carbon (C).

3. The vertical channel transistor of claim 1, wherein the leakage prevention area comprises silicon carbide (SiC).

4. The vertical channel transistor of claim 1, wherein the drain area comprises silicon.

5. The vertical channel transistor of claim 1, wherein the drain area comprises single crystalline silicon.

6. A method for fabricating a vertical channel transistor, comprising:
    forming a pillar over a substrate; and
    forming a gate electrode on sidewalls of the pillar,
    wherein the pillar comprises a source area, a vertical channel area over the source area, a leakage prevention area over the vertical channel area, and a drain area.

7. The method of claim 6, wherein the forming of the pillar comprises:
    forming a pillar pattern by etching the substrate;
    forming a leakage prevention area at an upper part of the pillar pattern;
    forming a silicon layer over the leakage prevention area; and
    forming a drain area and a source area by ion-implanting impurities into the silicon layer and a lower part of the pillar pattern.

8. The method of claim 7, wherein the forming of the leakage prevention area comprises performing ion implantation with a target set to a predetermined depth from the surface of the pillar pattern.

9. The method of claim 7, wherein the forming of the leakage prevention area comprises performing ion implantation on the surface of the pillar pattern.

10. The method of claim 7, wherein the forming of the leakage prevention area comprises performing epitaxial growth over the pillar pattern.

11. The method of claim 7, wherein the forming of the silicon layer comprises performing epitaxial growth over the leakage prevention area.

12. The method of claim 6, wherein the forming of the pillar comprises:
    forming a leakage prevention area over the substrate;
    forming a silicon layer over the leakage prevention area;
    forming the pillar by etching the leakage prevention area, the silicon layer, and the substrate; and
    forming a drain area and a source area by ion-implanting impurities into the silicon layer and a lower part of the pillar.

13. The method of claim 12, wherein the forming of the leakage prevention area comprises performing ion implantation with a target set to a predetermined depth from the substrate surface.

14. The method of claim 12, wherein the forming of the leakage prevention area comprises performing ion implantation on the substrate surface.

15. The method of claim 12, wherein the forming of the leakage prevention area comprises performing epitaxial growth on the substrate.

16. The method of claim 12, wherein the forming of the silicon layer comprises performing epitaxial growth on the leakage prevention area.

17. The method of claim 6, wherein the leakage prevention area comprises a layer containing carbon.

18. The method of claim 6, wherein the leakage prevention area comprises SiC.

19. A semiconductor device comprises:
    a pillar formed over a substrate including a buried bit line;
    a gate electrode formed on sidewalls of the pillar; and
    a capacitor connected to a drain area of the pillar,
    wherein the pillar comprises a source area connected to the buried bit line, a vertical channel area over the source area, a leakage prevention area over the vertical channel area, and a drain area over the leakage prevention area.

20. The semiconductor device of claim 19, wherein the leakage prevention area comprises a layer containing carbon.

21. The semiconductor device of claim 19, wherein the leakage prevention area comprises SiC.

* * * * *